United States Patent
Ando et al.

[11] Patent Number: 5,772,862
[45] Date of Patent: Jun. 30, 1998

[54] FILM COMPRISING SILICON DIOXIDE AS THE MAIN COMPONENT AND METHOD FOR ITS PRODUCTIION

[75] Inventors: Eiichi Ando; Akira Mitsui, both of Yokohama; Junichi Ebisawa, Tokyo; Koichi Suzuki, Yokohama; Kiyoshi Matsumoto, Tokyo; Takuji Oyama, Yokohama, all of Japan

[73] Assignee: Asahi Glass Company Ltd., Tokyo, Japan

[21] Appl. No.: 429,845

[22] Filed: Apr. 27, 1995

Related U.S. Application Data

[62] Division of Ser. No. 323,579, Oct. 17, 1994, Pat. No. 5,605,609, which is a continuation of Ser. No. 55,782, May 3, 1993, abandoned, which is a continuation of Ser. No. 671,801, Apr. 22, 1991, abandoned, which is a continuation-in-part of Ser. No. 318,330, Mar. 3, 1989, Pat. No. 5,110,637.

[30] Foreign Application Priority Data

| Mar. 3, 1988 | [JP] | Japan | 63-048765 |
| Mar. 31, 1988 | [JP] | Japan | 63-076202 |
| Jun. 14, 1988 | [JP] | Japan | 63-144827 |
| Oct. 21, 1988 | [JP] | Japan | 63-264163 |
| Aug. 1, 1989 | [JP] | Japan | 1-197993 |
| Sep. 1, 1989 | [JP] | Japan | 1-224484 |
| Jun. 21, 1990 | [JP] | Japan | 2-161413 |
| Aug. 1, 1990 | [WO] | WIPO | PCT/JP90/00982 |

[51] Int. Cl.$^6$ ................................................. C23C 14/34
[52] U.S. Cl. ............................. 204/298.13; 204/192.15; 204/192.23
[58] Field of Search ................. 204/192.15, 192.22, 204/192.21, 192.23, 192.26, 192.27, 192.28, 298.13

[56] References Cited

U.S. PATENT DOCUMENTS

| 3,763,026 | 10/1973 | Cordes | 204/192 |
| 4,063,211 | 12/1977 | Yasujima et al. | 338/308 |
| 4,849,081 | 7/1989 | Ross | 204/192.15 |
| 4,978,437 | 12/1990 | Wirz | 204/192.23 |

FOREIGN PATENT DOCUMENTS

| A-52-138512 | 11/1977 | Japan . |
| 54-66385 | 5/1979 | Japan . |
| 56-5345 | 1/1981 | Japan . |
| 57-79171 | 5/1982 | Japan . |
| A-57-100943 | 6/1982 | Japan . |
| 60-166240 | 8/1985 | Japan . |
| 60-224773 | 11/1985 | Japan . |
| A-61-34501 | 2/1986 | Japan . |
| A-61-51333 | 3/1986 | Japan . |
| 61-146533 | 7/1986 | Japan . |
| A-61-167546 | 7/1986 | Japan . |
| A-62-73202 | 4/1987 | Japan . |
| A-62-216944 | 9/1987 | Japan . |
| 63-64928 | 3/1988 | Japan . |
| 63-123838 | 5/1988 | Japan . |
| 63-144138 | 6/1988 | Japan . |
| 2-901 | 1/1990 | Japan . |

*Primary Examiner*—Nam Nguyen
*Attorney, Agent, or Firm*—Oblon, Spivak, McClelland, Maier & Neustadt, P.C.

[57] ABSTRACT

The present invention relates to a film comprising silicon dioxide as the main component, which contains Zr, etc., and a method for forming it by reactive DC sputtering. It makes it possible to form reflection preventive films, alkali barrier films and various multi-layered films such as multi-layered films for anti-iridescent glass, which contain said film comprising silicon dioxide as the main component, by a physical vapor deposition method without breaking a vacuum.

1 Claim, 3 Drawing Sheets

FILM COMPRISING SILICON DIOXIDE AS THE MAIN COMPONENT AND METHOD FOR ITS PRODUCTIION

This is a Division of application Ser. No. 08/323,579 filed on Oct. 17, 1994 now U.S. Pat. No. 5,605,609 which is a Continuation of application Ser. No. 08/055,782 filed on May 3, 1993 now abandoned, which is a Continuation of application Ser. No. 07/671,801 filed on Apr. 22, 1991 now abandoned, which is a Continuation-in-part of application Ser. No. 07/318,330 filed on Mar. 3, 1989 now patented (U.S. Pat. No. 5,110,637).

TECHNICAL FIELD

The present invention relates to a target material to be used for forming an oxide transparent thin film comprising silicon dioxide as the main component by a sputtering method and a film comprising silicon dioxide as the main component, formed by means of this target, as well as a multi-layered film using such a film.

BACKGROUND ART

Heretofore, it has been known to employ silicon dioxide or magnesium fluoride for a transparent thin film having a low refractive index. Such a thin film can be formed by a vacuum deposition method or a coating method. However, such film-forming methods are hardly applicable to formation of films on substrates with large areas and can not be used in a case where it is required to form a film with a large area such as in the case of glass for automobiles or for buildings. A DC sputtering method is most suitable for forming a film with a large area. However, there has been no target material suitable for providing a transparent thin film having a low refractive index. Thus, it has been impossible to obtain a desired thin film by means of a DC sputtering method capable of forming a film with a large area.

For example, in order to form a silicon dioxide thin film by a DC sputtering method, it is conceivable to employ a method wherein an electrically conductive Si target is subjected to reactive sputtering in an oxygen-containing atmosphere to form a silicon dioxide thin film. However, the surface of such Si target is oxidized during the sputtering, whereby the conductivity decreases, and sputtering can hardly be continued under a stabilized condition. Further, the formed silicon dioxide thin film has had a drawback that it is not durable against alkalinity.

Further, heretofore known as typical examples of a reflection preventive layer to be formed on the surface of a substrate for optics such as camera lenses, eye glasses or optical displays in order to reduce the surface reflection of such optics, are a single-layered anti-reflective film obtained by forming a thin film with a low refractive index to have an optical film thickness of $\lambda o/4$ ($\lambda o$: designed wave length, the same applies hereinafter), a double-layered anti-reflective film obtained by forming substances with low and high two types of refractive indices to have optical thicknesses of $\lambda o/4$–$\lambda o/2$ sequentially from the air side, a three-layered anti-reflective film obtained by forming substances with low, high and intermediate three types of refractive indices to have optical film thicknesses of $\lambda o/4$–$\lambda o/2$–$\lambda o/4$ sequentially from the air side, and a four-layered anti-reflective film obtained by laminating substances with low, high, intermediate and low refractive indices from the air side to have optical film thicknesses of $\lambda o/4$–$\lambda o/2$–$\lambda o/4$–$\lambda o/2$, respectively. On the other hand, with respect to application of such multi-layered reflection preventive films, a demand for large size commercial products such as show windows for shops has recently been seen in addition to a demand for the above-mentioned small size products such as camera lenses, eye glasses or optical displays. However, since the low refractive index material used for such multi-layered reflection preventive films, such as $MgF_2$ or $SiO_2$, is an insulating material, it is difficult to form such films by a DC sputtering method which is advantageous for a large size i.e. large area coating from the viewpoint of productivity. Usually, a vapor deposition method is employed for film-formation of such low refractive index substances. Therefore, there is no problem with respect to small size products such as camera lenses or eye glasses. However, with respect to a product with a large area, there is a problem such that it is necessary to control the film thickness uniformly. As a means for forming $MgF_2$ or $SiO_2$ into a film by a sputtering method, a method is available wherein film forming is conducted by a R.F. (high frequency) sputtering method employing a target made of a compound of $MgF_2$ or $SiO_2$. However, this method requires a time and costs for the preparation of the target, and the R.F. sputtering method itself is not entirely reliable from the viewpoint of the stability in production over a long period of time. As another means for forming $MgF_2$ or $SiO_2$ into a film by a sputtering method, it is conceivable to form a film from a Mg or Si target by a reactive sputtering method. However, in the case of $MgF_2$, it is necessary to use fluorine which is a corrosive gas, and there is a problem in the maintenance of the apparatus. In the case of $SiO_2$, there is no such problem since the sputtering gas is oxygen, but since Si is semiconductor, DC sputtering tends to be difficult, and the film-forming speed is usually slow, whereby the production time is prolonged, which is disadvantageous from the viewpoint of costs.

Glass sheets as transparent material are chemically stable, excellent in the surface hardness, durable at a high temperature at a level of from 500° C. to 700° C. and excellent also in the electrically insulating properties and optical properties, and they are used not only as window glass material for buildings, vehicles and air crafts but also for optical parts, electrical parts, electronic parts, etc. In particular, an electrically conductive glass sheet having a conductive coating film formed on a glass sheet surface is employed as an amorphous solar cell substrate or as a display element such as a liquid display element, an electrochromic element or an electric field light emitting element. Soda lime silica glass sheets which are inexpensive and most commonly employed, tend to be used as glass substrates for such electrically conductive glass sheets. However, such soda lime silica glass sheets contain from 10 to 20 wt % of an alkali component such as sodium or potassium. Accordingly, they have a drawback that when used for a long period of time, the coated conductive film undergoes a property deterioration due to the diffusion of alkali ions to the surface from the glass substrate. For example, turbidity is likely to form in the conductive film of the electrically conductive glass sheet, whereby the transparency is likely to decrease, or the electric resistance of the conductive film is likely to increase, or the chemicophysical durability tends to deteriorate. Namely, in a liquid crystal display element, an oxidation-reduction reaction takes place at the display electrode surface due to the alkali diffused from glass, whereby an indium oxide film (ITO film) or a tin oxide film (nesa film) is modified, and the liquid crystal itself undergoes electrolysis and deteriorates. Also in an electrochromic element, electrodes are likely to wear out for the same reason, which causes a deterioration of the durability of tungsten oxide or molybdenum oxide as the electrochromic material, whereby the element tends to deteriorate. Likewise, in the case of an electric field light emitting element, an alkali oozed out of the glass surface by diffusion is likely to penetrate through a conductive film into the light emitting material, whereby the light emitting efficiency or the emitted color is likely to be changed. Further, in the case of an amorphous solar cell, the electric resistance of the conductive film tends to increase, whereby the photoelectric conversion efficiency is likely to be substantially lowered. In some cases, the alkali penetrated through the electrodes is likely to diffuse into the amorphous silicon, thus leading to a deterioration of the conversion efficiency.

Otherwise, alkali-containing glass such as soda lime silica glass has a tendency such that when it is treated at a high temperature, alkali ions tend to readily migrate. Therefore, there is a drawback that due to diffusion of alkali ions during a high temperature treatment for the preparation of conductive glass or various coated glass, the performance of the conductive film or the coated film tends to deteriorate.

A typical method for solving such a drawback is a method of forming a certain thin film capable of preventing the alkali diffusion, on the surface of usual soda lime silica glass, and a silica film is commonly employed for this purpose. A silicon oxide film (such as a $SiO_2$ film) is used for preventing the alkali diffusion for such reasons that the film is amorphous and when another thin film such as a conductive film is to be formed thereon, it is possible to form substantially the same film as formed on glass. The refractive index of the silicon oxide film is close to that of glass although it is slightly lower than glass, and it is transparent to light usually in a wider range than a glass sheet, whereby the transparency of glass will not thereby be impaired.

However, while a conductive film to be formed on an alkali barrier film is usually formed by a DC sputtering method capable of forming a uniform film over a large area at a high speed, the silicon oxide film can not be formed by such a DC sputtering method, because if it is attempted to form the silicon oxide film by a DC sputtering method using a Si target, the surface of the Si target tends to be oxidized, whereby the electric conductivity will deteriorate, and sputtering can not be continued under a stabilized condition. Therefore, silicon oxide film used to be formed by a RF sputtering method or a CVD (chemical vapor deposition) method using an oxide target.

Therefore, separately from the method of forming the conductive film, it is required to conduct tuning of the RF sputtering or control of the sputtering atmosphere for the silicon dioxide film, or it is required to form a film by the CVD method using a separate apparatus, whereby it is impossible to continuously form the conductive film and the silicon dioxide film in line, and thus there has been a problem that the productivity is poor.

As is well known, a number of proposals have been made for the technique for preparing functional glass by applying a coating 31 on the surface of glass 30, as shown in FIG. 3. For example, an interference filter, a reflection preventive film, a heat radiation reflecting glass, a transparent conductive glass, an electromagnetic wave shielding glass and an electric heating windshield glass may be mentioned. In the transparent conductive glass, the heat mirror, the electromagnetic shielding glass and the electric heating windshield glass among them, a transparent oxide conductor is formed as a main constituting layer 31 in many cases. Particularly, indium-tin oxide (ITO), fluorine-doped tin oxide ($SnO_2$:F) or aluminum-doped zinc oxide (ZnO:Al) is used in many cases. Further, as an ultraviolet cutting glass, a product having a zinc oxide (ZnO) layer coated as an ultraviolet absorbing layer on the surface of glass, may be mentioned.

However, each of these transparent oxide materials has a refractive index of from 1.8 to 2.2 which is large as compared with glass, whereby the reflectance will be high at a wavelength satisfying the interference conditions. This will be observed as the maximum (ripple) in a spectral reflection (transmission) spectrum. Accordingly, when a thin film of such material is coated on a glass sheet having a large area, the wavelength at the maximum reflection is shifted due to a variation (irregularity) of the in-plane film thickness, which will be recognized by eyes as color shading of the reflected color.

An extremely high level of technique is required to control the film thickness distribution on a glass surface within ±5% by vapor deposition or CVD when a glass sheet of 1 m×1 m is taken for example, although it depends also on the method for forming the film. According to our study, in a case where the film thickness distribution is assumed to be at the above level, the in-plane color shading reaches a problematic level when the above-mentioned transparent oxide film is formed on the glass substrate in a thickness of 0.15 μm or more. On the other hand, as the film thickness increases, chromaticness of the reflected color decreases, and with a thickness of 0.6 μm or more, colorfulness tends to decrease. However, for the colorfulness to decrease sufficiently to a level where it can hardly be recognized as color shading, the film thickness is required to be at least 3 μm, preferably at least 5 μm.

Further, even if the film thickness distribution can be controlled uniformly, the large ripple in the spectrum still remains and will be recognized by eyes as a colorful color. If this is formed on a large sized glass, the maximum reflection wavelength is shifted depending upon the sight angle i.e. the angle between the glass surface and the line of sight, whereby the color changes, which is again recognized has color shading. Accordingly, it is desired to minimize the ripple in the spectrum itself.

When the film thickness is less than 0.15 μm, the variation in the film thickness distribution will be ±75 Å, whereby no substantial in-plane color shading will be recognized, but the color shading due to the sight angle will still be a problem.

Thus, when a transparent film with a high refractive index is formed on a glass substrate in a thickness exceeding a certain level, the glass exhibits glaring (color shading) depending upon the in-plane film thickness distribution or the change in the sight angle, whereby the commercial value may substantially be impaired.

Some proposals have been made to prevent such color shading. Japanese Examined Patent Publication No. 39535/1988 proposes to use an infrared reflecting substance as a high refractive index transparent film and to provide a layer having a refractive index n=1.7–1.8 to the glass and a film thickness d=0.64–0.080 μm. There is no particular suggestion for the specific means of providing this layer, but vacuum vapor deposition or atmospheric pressure CVD is exemplified, and it is described that atmospheric pressure CVD is advantageous taking the coating on a large sized glass sheet into consideration, and only atmospheric CVD is described in Examples.

In Japanese Unexamined Patent Publication No. 201046/1989, a technique of forming $SiC_xO_y$ is shown as a practical means for forming this primer layer. This is a method wherein a float method is assumed for the process for production of a sheet glass, and a gas mixture comprising silane, an unsaturated hydrocarbon compound and carbon dioxide is blown to the glass surface in a tin tank furnace. This is basically a method for forming an intermediate refractive index transparent film by atmospheric pressure CVD.

Film-forming by atmospheric pressure CVD is very effective particularly from the viewpoint of costs in a case where a large amount of glass is treated continuously (so-called on-line) in the process for its production. On the other hand, it has a drawback that it is unsuitable for forming a multi-layered film or for the production of various kinds in small amounts. Therefore, it is now common to employ a production system of a sputtering method for the production of heat radiation reflecting glass for automobiles or buildings. The sputtering method has merits such that it is excellent in the control and the uniformity of the film thickness, and production of various products in small amounts or forming of a multi-layered film is easy. Further, it has an additional merit that its combination with other vacuum-film forming means such as vapor deposition or plasma CVD is easy from the viewpoint of design of apparatus. Therefore, it has been desired to prepare an intermediate refractive index undercoating film for preventing iridescence, by sputtering. On the other hand, the sputtering method has drawbacks that the film-forming speed is slow, and the cost is high. Therefore, a study is actively conducted to increase the film-forming speed by sputtering. It is the most serious drawback of the system that the film-forming speed is extremely slow when a metal oxide coating film is formed by reactive sputtering from a metal target, and it has been considered difficult to form a film of an intermediate refractive index transparent material which is stable and excellent in the durability, at a high speed by sputtering.

DISCLOSURE OF THE INVENTION

A first object of the present invention is to solve the above problems and to provide a method for forming a low refractive index oxide transparent thin film comprising silicon dioxide as the main component by a reactive DC sputtering method capable of forming a film with a large area, a target material to be used for the method, and a film comprising silicon dioxide as the main component, which is formed by the reactive DC sputtering method. A further object is to overcome the low alkali resistance of a silicon dioxide thin film.

The present invention provides a target for sputtering, which is capable of solving problems of the low alkali resistance of a silicon oxide thin film and the decrease of electric conductivity due to surface oxidation during the sputtering of Si target. Namely, it provides a target for sputtering comprising Si as the main component, which contains at least one member selected from Zr, Ti, Ta, Hf, Mo, W, Nb, Sn, In, La and Cr in a total amount of from 4 to 35 atoms relative to from 65 to 96 atoms of Si.

In the present invention, the total content of Zr, Ti, Ta, Hf, Mo, W, Nb, Sn, In, La, Cr, etc. is preferably from 4 atomic % to 35 atomic % based on the total amount including Si. Particularly preferred is a total content of from 4 atomic % to 15 atomic % for the reason that the refractive index of a thin film thereby formed will be very low at a level of not higher than 1.6. If the content of Zr, etc. is less than 4 atomic %, it becomes difficult to conduct sputtering under a stabilized condition due to surface oxidation of the target, and the alkali resistance of the resulting thin film (e.g. a Si-Zr-O type) will be poor. If the content of Zr, etc. is larger than 35 atomic %, the refractive index of the resulting thin film tends to be high, such being undesirable in a case where a film with a low refractive index is to be formed.

A uniform film can be formed when sputtering is conducted using the target of the present invention in an atmosphere of a mixture of Ar and oxygen under a vacuum of from $1\times10^{-3}$ to $1\times10^{-2}$ Torr. The target of the present invention is electrically conductive, and yet surface oxidation of the target during sputtering is minimum, whereby film-forming can be conducted by means of a DC sputtering method, and a uniform film over a large area can be formed at a high speed. Of course, the target of the present invention is capable of forming a similar film also by means of a high frequency (RF) sputtering method or the like.

In the foregoing, a non-oxide target has been described. However, a low refractive index film of the present invention can likewise be formed by conducting RF sputtering using an oxide target comprising $SiO_2$ as the main component, which contains at least one member selected from Zr, Ti, Ta, Hf, Mo, W, Nb, Sn, In, La and Cr in a total amount of from 4 to 35 atoms relative to from 65 to 96 atoms of Si.

Further, a low refractive index film of the present invention can also be formed by a vapor deposition method such as vacuum vapor deposition or ion plating using, as a tablet, a material comprising $SiO_2$ as the main component, which contains at least one member selected from Zr, Ti, Ta, Hf, Mo, W, Nb, Sn, In, La and Cr in a total amount of from 4 to 35 atoms relative to from 65 to 95 atoms of Si.

The target or tablet of the present invention can be prepared, for example, by the following method. For example, in a case of a Si-Zr type target or tablet, the target or tablet of the present invention can be formed by subjecting a powder mixture of at least two members selected from a zirconium silicide or silicon metal, zirconium metal, zirconium silicide and zirconium oxide (inclusive of zirconia stabilized or partially stabilized by an addition of from 3 to 8 mol % of $Y_2O_3$, CaO, MgO, etc.) to high temperature high pressure pressing, high pressure pressing or high pressure pressing, followed by baking. In such case, the particle size of the powder is suitably from 0.05 $\mu$m to 40 $\mu$m. Further, the above target may contain iron, aluminum, magnesium, calcium, yttrium, manganese and hydrogen in a total amount of at most 3 wt %. Carbon may be contained in an amount of at most 20 wt %, since carbon is converted to $CO_2$ and disappears during the film-forming. Further, the target of the present invention exhibits similar effects even when copper, vanadium, cobalt, rhodium, iridium, etc. are included at a level of impurities.

Table 1 shows the properties of films formed by conducting reactive DC sputtering in an atmosphere of a mixture of Ar and $O_2$ using various non-oxide targets of the present invention. Table 1 also shows some examples in which film-forming is conducted by reactive RF sputtering using other targets, for the purpose of comparison. With respect to the films formed by using various targets, the compositional ratio of the constituting substances, such as the ratio of e.g. Zr to Si, in the target was substantially maintained in the films.

With respect to the alkali resistance of film in Table 1, a film was immersed in 0.1N NaOH at room temperature for 240 hours, whereupon the one wherein the change in the film thickness was within 10% relative to the thickness prior to the immersion was evaluated to be ◯, and the one wherein the film was dissolved, was evaluated to be X.

A film was formed in a film thickness of 1000 Å using as a substrate a soda-lime glass sheet prepared by a float method, and it was used as a sample for evaluation. The film thickness was obtained by measuring by a Taly step method a step prepared by a mask during the film-forming.

With respect to the acid resistance, a film was immersed in a 0.1N $H_2SO_4$ aqueous solution at room temperature for 240 hours, whereupon the one in which the change in the film thickness was within 10% relative to the thickness before the immersion was evaluated to be ◯. Further, with respect to the water resistance, a film was immersed in distilled water at 100° C. under 1 atm for 2 hours, whereupon the one wherein the change of the film thickness was within 10% relative to the thickness before the immersion, was evaluated to be ◯.

As shown in Table 1, the refractive indices of the oxide films formed by using the targets of the present invention are from 1.47 to 1.74, which are very small as compared with the oxide films prepared by using the targets as shown in Comparative Examples 1 to 4. As shown by Examples 3, 4, 6 and 8 of the present invention, those wherein Si is at least 90 atomic %, have refractive indices of at most 1.5, which were substantially the same as the refractive index of the $SiO_2$ film. Besides, the films prepared by using the targets of the present invention were excellent also in the alkali resistance.

TABLE 1

| Sample No. | Composition of target | Refractive index of film | Alkali resistance of film | Acid resistance of film | Water resistance of film |
|---|---|---|---|---|---|
| Comparative Example 1 | Zr | 2.1 | ◯ | ◯ | ◯ |
| Comparative Example 2 | Ti | 2.3 | ◯ | ◯ | ◯ |
| Comparative Example 3 | Ta | 2.2 | ◯ | ◯ | ◯ |
| Comparative Example 4 | Sn | 2.0 | ◯ | ◯ | ◯ |
| Comparative Example 5 | Si | 1.46 | X | ◯ | ◯ |
| Example 1 | 67Si—33Zr | 1.74 | ◯ | ◯ | ◯ |
| Example 2 | 80Si—20Zr | 1.57 | ◯ | ◯ | ◯ |
| Example 3 | 90Si—10Zr | 1.49 | ◯ | ◯ | ◯ |
| Example 4 | 95Si—5Zr | 1.47 | ◯ | ◯ | ◯ |
| Example 5 | 67Si—33Ti | 1.66 | ◯ | ◯ | ◯ |
| Example 6 | 90Si—10Ti | 1.51 | ◯ | ◯ | ◯ |
| Example 7 | 67Si—33Hf | 1.75 | ◯ | ◯ | ◯ |
| Example 8 | 90Si—10Hf | 1.49 | ◯ | ◯ | ◯ |

Further, with respect to the $SiO_2$ film formed in Comparative Example 5 and the $10Zr$-$90SiO_x$ film formed in Example 3, hardness and internal stress were measured.

The hardness was measured by a dynamic super fine hardness meter (load: 1 g, indenter point angle: 115, DH: 115) manufactured by Shimadzu Corporation with respect to the above films in a film thickness of 1000 Å, whereby the $SiO_2$ film of Comparative Example 5 had a relative value of 499, whereas the $10Zr$-$90SiO_x$ film of Example 3 had a value of 614 and thus was found to be very hard. With respect to the internal stress, the $SiO_2$ film of Comparative Example 5 had a value of $10^{10}$ dyn/cm$^2$, whereas the $10Zr$-$90SiO_x$ film of Example 3 had a value of not higher than $10^9$ dyn/cm$^2$ and thus was found to have a very small internal stress.

In the non-oxide target of the present invention, most of Zr, Ti, Hf, Mo, W, Nb, Sn, Ta, In, La, Cr, etc. in the target are present in the form of silicon compounds, and Sn is present in the form of a Si-Sn alloy. Thus, their activities to oxygen are small as compared with Si, and they are hardly oxidized, whereby they serve to prevent the decrease of the electric conductivity due to surface oxidation of the target. A second object of the present invention is to overcome the above drawbacks inherent to the prior art by using the above described film comprising silicon dioxide as the main component and to provide a large size reflection preventive film which is useful for buildings or automobiles, at low costs. Namely, the present invention has been made to solve the above-mentioned problems and provides a anti-reflective film having a low refractive index film at least at the outermost layer as counted from the air side, wherein the above low refractive index film is a film comprising as the main component a composite oxide containing Si and at least one member selected from Zr, Ti, Hf, Mo, W, Nb, Sn, Ta, In, La and Cr.

The point of observation in the present invention is that in a composite oxide containing Si and at least one member selected from Zr, Ti, Hf, Mo, W, Nb, Sn, Ta, In, La and Cr, such as a $ZrSi_yO_z$ film, the refractive index changes continuously as the proportion of Si changes.

Specifically, in a $ZrSi_{yOz}$ system, as the atomic ratio y of Si to Zr increases from 0 to 9.0, the refractive index decreases continuously from 2.1 to 1.5.

Table 2 shows refractive indices of films made of composite oxides. In each case, film-forming was conducted by reactive sputtering by using a target having a composition as identified in the Table.

TABLE 2

| Substances constituting target | Composition of target (atomic %) | Film composition Si(y) | Film composition O(z) | Refractive index n |
|---|---|---|---|---|
| Zr—ZrSi$_2$ | 95Zr—5Si | 0.045 | 2.1 | 2.13 |
| Zr—ZrSi$_2$ | 91Zr—9Si | 0.1 | 2.2 | 2.12 |
| Zr—ZrSi$_2$ | 80Zr—20Si | 0.25 | 2.5 | 2.05 |
| Zr—ZrSi$_2$ | 70Zr—30Si | 0.4 | 2.9 | 1.92 |
| Zr—ZrSi$_2$ | 50Zr—50Si | 1 | 4 | 1.75 |
| ZrSi$_2$ | 33Zr—67Si | 2.0 | 6.0 | 1.71 |
| ZrSi$_2$—Si | 20Zr—80Si | 4 | 10 | 1.57 |
| ZrSi$_2$—Si | 10Zr—90Si | 9 | 20 | 1.50 |
| ZrSi$_2$—Si | 5Zr—95Si | 19 | 40 | 1.47 |

It should be noted here that with the films having compositions of $Zr_{10}Si_{90}O_z$ and $Zr_5Si_{95}O_z$, the refractive index can be as low as 1.5 and 1.47, respectively. These values are slightly short to the value of 1.46 of $SiO_2$, but are sufficiently useful as a material for low refractive index films for a multi-layered reflection preventive film. Further, as is different from a $SiO_2$ film, these films are excellent in alkali resistance, and improvement in the durability can be expected. Furthermore, when such a $Zr_{10}Si_{90}O_z$ film or a $Zr_5Si_{95}O_z$ film is formed by a reactive sputtering method, the Zr-Si alloy used as the target has electric conductivity, as mentioned above, whereby there is a substantial merit that DC sputtering can be employed. This is substantially advantageous as compared with the fact that usual Si targets are semiconductors, whereby DC sputtering can hardly be employed. Besides, the film-forming speed of these films by the reactive sputtering method is substantially high as compared with the $SiO_2$ film, whereby the production time can be shortened, which is advantageous also from the viewpoint of costs.

Accordingly, the above-mentioned low refractive index film comprising silicon dioxide as the main component of the present invention can be used as a low refractive index film for various reflection preventive multi-layered films, such as a single-layered anti-reflective film formed on a transparent substrate in an optical film thickness of λo (designed wavelength, the same applies hereinafter), a double-layered anti-reflective film having two substances having low and high refractive indices formed in optical film thicknesses of ($\lambda$o/4–$\lambda$o/2) sequentially from the air side, a three-layered anti-reflective film having three substances having low, high and intermediate refractive indices formed in this order, in optical film thicknesses of ($\lambda$o/4–$\lambda$o/2–$\lambda$o/4) sequentially from the air side, and a four-layered anti-reflective film having substances of low, high, intermediate and low refractive indices overlaid from the air side in optical film thicknesses of ($\lambda$o/4–$\lambda$o/2–$\lambda$o/4–$\lambda$o/2) respectively. Further, the reflection preventive multi-layered film can be formed continuously by a physical vapor deposition method without breaking a vacuum.

Now, let us consider the actual production of a three-layered anti-reflective film according to the present invention. A three-layered anti-reflective film is widely practically used, since a low reflectance can thereby be realized within a wide wavelength region covering the entire visible light region. In order to prepare such a three-layered anti-reflective film according to the present invention, a $ZrSi_yO_z$ film having an optical film thickness of $\lambda$o/4 and a refractive index of 1.49 is formed on the surface of a substrate as the first layer counted form the air side. This film having a refractive index of 1.49 can be realized simply by slightly adjusting the above-mentioned composition of $Zr_{10}Si_{90}O_z$. As a second layer, a $ZrSi_xO_z$ film having an optical film thickness of $\lambda$o/2 and a refractive index of 2.05 is formed. This film having a refractive index of 2.05 can be realized by adjusting the atomic ratio x of Si to Zr to a level of about 0.25 according to Table 2. In this case, the intermediate refractive index required for the third layer will be about $1.49 \times (1.52)^{1/2}$ e.g. when the refractive index $n_0$ of the substrate (a soda lime glass plate) is 1.52 and the refractive index of the $ZrSi_yO_z$ film as the first layer is 1.49 according to the condition for the three-layered anti-reflective film ($n_3=n_1 \cdot n_0^{1/2}$). A film having such a refractive index can readily be obtained by adjusting the atomic ratio of Si to Zr according to Table 2.

Further, a anti-reflective film of more than three layers may be formed in the same manner by adjusting the refractive indices of the respective constituting films.

The point for such a multi-layered anti-reflective film is the material for a low refractive index film. Here, according to the present invention, a film of a refractive index of 1.5 can be realized, as described above, by adjusting the atomic ratio y of Si to Zr in $ZrSi_yO_z$. The refractive index can further be reduced by increasing y. However, if the proportion of Si is too large, it becomes difficult to form a film by a DC sputtering method as described above, and further, the alkali resistance of the film tends to be low. The lower limit for y as the material for a low refractive index film can not strictly be prescribed because it is influenced by the type of the material of a high refractive index film to be combined. However, if the refractive index of this low refractive index material is too high, the high refractive index material to be combined tends to be restricted, and the reflection preventive performance is likely to be low. Therefore, the refractive index is suitably at a level of not higher than 1.7. Accordingly, the value for y is preferably within a range of from 2 to 19.

In the present invention, as a substrate for forming a reflection preventive film, glass, plastics or films may be employed. It is preferably transparent with a refractive index of about from 1.45 to 1.60.

As the material for the high refractive index film or for the intermediate refractive index film in the anti-reflective film of the present invention, the one having the refractive index increased by reducing the atomic ratio y of Si to Zr in the $ZrSi_yO_z$ may be used as mentioned above. However, the material is not limited to such a specific example, and it is possible to use e.g. $TiO_2$, $ZrO_2$, ZnS or $Ta_2O_5$ as a commonly employed high refractive index material. However, by using the same $ZrSi_yO_z$ for both the high refractive index material and the low refractive index material, it is possible to prevent ply separation which is likely to occur between materials of different types, whereby an effect for improvement of the adhesive strength can be expected.

As a method for preparing a anti-reflective film in the present invention, a usual method such as vapor deposition, sputtering or CVD (chemical vapor deposition) may be employed. However, in order to sufficiently obtain the effects of the present invention, it is preferred to employ a sputtering method. Because the feature of the present invention resides in that a low refractive index film can be formed by DC sputtering as described above. To form a low refractive index film of the present invention by DC sputtering, an alloy target of Zr and Si is used as the target, and a gas mixture of Ar and $O_2$ is used for the sputtering gas. On the other hand, the high refractive index film may likely be prepared by reactive sputtering from the alloy target of Zr and Si. However, other materials may be employed, so long as the metal targets of the respective materials are employed. Further, when a high refractive index film is to be formed, a conductive material such as sintered ITO may be employed as the target.

In the foregoing, description was made with respect to a film comprising as the main component a composite oxide containing Si and Zr. However, the same will apply to material other than Zr such as Ti, Hf, Sn, Ta or In.

A third object of the present invention is to provide a conductive glass provided with an alkali barrier film to prevent diffusion of alkali ions from glass of an alkali-containing glass, by means of the above-mentioned film comprising silicon dioxide as the main component.

Namely, with respect to the above object, the present invention has been made on the basis of a discovery of a novel alkali barrier film which can be formed by a DC sputtering method and provides an electrically conductive glass having an alkali barrier layer for preventing the diffusion of alkali from an alkali-containing glass and an electrically conductive layer sequentially formed on the surface of the alkali-containing glass, wherein the above alkali barrier layer is a film comprising as the main component an oxide containing Si and at least one member selected from Zr, Ti, Hf, Mo, W, Nb, Sn, Ta, In, La and Cr, and a process for producing an electrically conductive glass which comprises forming an alkali barrier film comprising as the main component, an oxide containing Si and at least one member selected from Zr, Hf, Nb, Sn, La, Ti, Ta, Mo, W, Cr and In, on the surface of an alkali-containing glass, followed by forming an electrically conductive film.

The composition for the alkali barrier film of the present invention is preferably such that Si is contained in a proportion of at least 5 atoms of Si relative to 95 atoms in total of metals such as Zr, Hf, etc. If the content of Si is less than this proportion, the film tends to be crystalline, whereby the alkali barrier performance tends to remarkably deteriorate. Further, it is preferred that Si is contained in a proportion of not more than 96 atoms of Si relative to 4 atoms in total of metals such as Zr, etc. If the content of Si is higher than this proportion, it becomes difficult to form a film by a DC sputtering under a stabilized condition due to surface oxidation of the target.

The refractive index of the alkali barrier film of the present invention can freely be adjusted by controlling the composition. The change in the refractive index due to the change of the composition of an alkali barrier film is shown in Table 3 with respect to a case where Zr is used as the metal.

TABLE 3

| Atomic ratio in the film composition of Zr and Si oxides | | Boiling test *1 | Refractive index n | Crystal-linity | Alkali barrier property *2 |
|---|---|---|---|---|---|
| Zr | Si | | | | |
| 96 | 4 | ○ | 2.13 | Crystalline | x |
| 91 | 9 | ○ | 2.12 | Amorphous | ○ |
| 80 | 20 | ○ | 2.05 | Amorphous | ○ |
| 70 | 30 | ○ | 1.92 | Amorphous | ○ |
| 50 | 50 | ○ | 1.75 | Amorphous | ○ |
| 33 | 67 | ○ | 1.71 | Amorphous | ○ |
| 20 | 80 | ○ | 1.57 | Amorphous | ○ |
| 10 | 90 | ○ | 1.50 | Amorphous | ○ |
| 5 | 95 | ○ | 1.47 | Amorphous | ○ |

(Film thickness being 1000 Å in all cases)
*1: A sample was immersed in a water at 100° C. under 1 atm for 2 hours, whereupon the one wherein the changes in $T_v$ (visible light transmittance) and $R_v$ (visible light reflectance) were within 1% as compared with those before the immersion, was evaluated to be ○.
*2: A sample was stored in contact with pure water at 90° C. for 24 hours, whereupon the one wherein the amount of $Na^+$ eluted into pure water was at least 0.8 $\mu g/cm^2$, was evaluated to be X, and the one wherein the amount of such eluted $Na^+$ is less than 0.8 $\mu g/cm^2$, was evaluated to be o.

Accordingly, in the case of an electrically conductive glass as a transparent electrode plate for e.g. a display element wherein a transparent electrode such as an ITO film (an indium oxide film containing tin) is formed as an electrically conductive film, if the composition of the alkali barrier film of the present invention is adjusted so that the refractive index will be the same as the refractive index of such a transparent electrode, there will be no difference in the refractive index between the portion where a transparent electrode pattern is formed on the alkali barrier film and the portion where no transparent electrode is formed and only the alkali barrier film is formed, whereby the transparent electrode pattern will not be prominent, and it is possible to prevent a so-called "see-through" phenomenon of the transparent electrode pattern. For example, in an electrically conductive glass having a structure of glass plate/alkali barrier film composed of oxides containing Zr and Si/ITO film, the composition may be controlled to be Zr:Si=70:30 in accordance with Table 1 so that the refractive index will be adjusted to about 1.9 of the refractive index of the ITO film. Otherwise, in a case where it is desired that the transparent electrode pattern can be seen for the purpose of registration in the production of a display element, the refractive index can be differentiated from the refractive index of the ITO film, and the refractive index can be made low by increasing the proportion of Si. In this manner, the composition of the alkali barrier film of the present invention may suitably be selected depending upon the refractive index of the conductive film to be formed thereon.

The film thickness of the alkali barrier film of the present invention is preferably at least 50 Å so that adequate alkali barrier performance can be obtained. Especially, a thickness within a range of from 100 Å to 5000 Å is most practical.

As glass useful for the electrically conductive glass of the present invention, not only the most commonly employed soda lime silica glass containing from 10 to 20 wt % of Na or K, but also various other alkali-containing glasses may be mentioned.

In the electrically conductive glass of the present invention, the conductive film to be formed on the above-mentioned alkali barrier film, is not particularly limited so long as it is a conductive film which is susceptible to deterioration by alkali ions, for example, a transparent conductive oxide film such as an ITO film, a F- or Sb-doped $SnO_2$ film or an Al-doped ZnO film, or a film of conductive metal such as Ag or Au.

The alkali barrier film of an electrically conductive glass of the present invention can be formed by a DC sputtering method. Therefore, a film which is uniform over a large area can be formed at a high speed under a stabilized condition. This means that when a conductive film to be formed on the alkali barrier film is formed by a physical vapor deposition method using a vacuum such as a DC sputtering method, the alkali barrier film and the conductive film can continuously be formed in an in-line type vacuum process apparatus without breaking the vacuum, which is particularly advantageous from the viewpoint of the productivity.

Further, a fourth object of the present invention is to provide a anti-iridescent glass having prevented glaring (color shading) which used to be a problem when a high refractive index transparent film is formed on a glass substrate in a thickness of at least 0.15 $\mu$m using a film comprising silicon dioxide as the main component.

Namely, the present invention provides a anti-iridescent glass having a high refractive index transparent thin film with a refractive index n of at least 1.8 and a thickness d of at least 0.15 $\mu$m formed on a glass substrate and having a transparent undercoating film with n=1.65–1.8 formed in an optical film thickness nd=0.1–0.18 $\mu$m between the high refractive index transparent thin film and the glass substrate, wherein said transparent undercoating film is a film comprising as the main component a composite oxide containing Si and at least one member selected from Zr, Ti, Ta, Hf, Mo, W, Nb, Sn, In, La and Cr.

FIG. 1 shows a cross sectional view of one example of the anti-iridescent glass of the present invention. 10 indicates a glass substrate, 11 indicates a high refractive index transparent thin film having n≧1.8 and d≧15 $\mu$m, and 12 indicates a transparent undercoating film.

As the high refractive index transparent thin film 11 of the present invention, indium-tin oxide, fluorine-doped tin oxide or zinc oxide may, for example, be mentioned. However, it is not limited to such specific examples.

The transparent undercoating film 12 of the present invention is a thin film having n (refractive index)=1.65–1.8 and nd (optical film thickness)=0.1–0.18 $\mu$m to prevent glaring. The constituting material is preferably a film comprising as the main component a composite oxide containing Si and at least one member selected from Zr, Ti, Ta, Hf, Mo, W, Nb, Sn, In, La and Cr, because, such a film can be formed at a high speed by reactive sputtering by means of a DC sputtering method in an oxygen-containing atmosphere using an alloy target containing Si and metals such as Zr, etc., and it is excellent in the physical and chemical durability. Especially, a composite oxide containing Zr and Si is particularly preferred since it is excellent in both acid resistance and alkali resistance. Further, a composite oxide containing Si and metals such as Zr, etc., has a merit that the refractive index can be adjusted to a desired value by controlling the blending ratio. In the case of a Zr-Si-O film, in order to obtain n=1.65–1.8, it is advisable to control the amount of Si to at least 50 atoms and at most 150 atoms, relative to 50 atoms of Zr.

The same effects can be obtained also by a laminated glass which is prepared by laminating the above-mentioned anti-iridescent glass on another glass substrate with a plastic interlayer interposed therebetween to form a structure of glass/transparent undercoating film/high refractive index transparent thin film/interlayer/glass.

The color shading is caused by the interference of lights at the upper and lower interfaces of the high refractive index transparent thin film. Therefore, the spectrum will have the maximum and the minimum (ripple), and deviation of the maximum and minimum due to variation of the film thickness of the high refractive index thin film is observed as color shading.

And, the transparent undercoating film of the present invention serves to prevent the reflection at the interface between the glass and the high refractive index transparent thin film. The result will be as if this interface has disappeared, whereby there will be no reflection or interference of lights by transmittance. Namely, the ripple in the spectrum disappears, and there will be no change in the spectrum even if the film thickness is varied. Strictly speaking, this effect for preventing the reflection due to interference of lights is varied only at a certain one wavelength (main wavelength), and the ripple remains to some extent at other wavelengths.

Therefore, as a method for more effectively preventing the ripple, it is preferred to provide a reflection-preventing transparent top coating film on the top of the high refractive index transparent thin film as shown in FIG. 2.

FIG. 2 is a cross sectional view of another example of the anti-iridescent glass of the present invention, in which 20 indicates a glass substrate, 21 indicates a high refractive index transparent thin film (the same thin film as 11 in FIG. 1), 22 is a transparent undercoating film (the same thin film as 12 in FIG. 1) and 23 is a transparent top coating film. By this arrangement, it is possible to diminish interference of lights at both the upper and lower interfaces of the high refractive index transparent thin film, whereby it is possible to obtain a anti-iridescent glass which is substantially completely free from iridescence.

As such a transparent top coating film 23, the one having n=1.35–1.55 and nd=0.045–0.075 $\mu$m, is preferred. The constituting material is not particularly limited, and $SiO_2$ may be used. However, a composite oxide film containing Si and at least one member selected from Zr, Ti, Ta, Hf, Mo, W, Nb, Sn, In, La and Cr, is preferred since a film having n=1.35–1.55 can thereby be formed at a high speed by a reactive sputtering method by means of DC sputtering depending upon the compositional ratio. With respect to a mixed oxide film containing Zr and Si, a composition of at least 80 atoms of Si relative to 20 atoms of Zr, is preferred since the refractive index will thereby be n$\leq$1.55. On the other hand, if Si is not more than 96 atoms relative to 4 atoms or Zr, a decrease of the electric conductivity due to surface oxidation of the alloy target during the reactive sputtering can be prevented, whereby the reactive sputtering by a DC sputter can be conducted under a stabilized condition.

Further, by suitably shifting the main wavelengths $\lambda_1=4n_1d_1$ and $\lambda_2=4n_2d_2$ capable of preventing the reflection of the above transparent undercoating film 22 (refractive index: $n_2$, optical film thickness: $n_2d_2$) and transparent top coating film 23 (refractive index: $n_1$, optical film thickness: $n_1d_1$), the wavelength range wherein the remaining ripple is sufficiently controlled, can be enlarged, and the iridescence-preventing effects can further be improved. For example, by adjusting them to $\lambda_1 \geq 0.55$ $\mu$m and $\lambda_2 \leq 0.55$ $\mu$m, or to $\lambda_1 \leq 0.55$ $\mu$m and $\lambda_2 \geq 0.55$ $\mu$m, it is possible to sufficiently control the remaining ripple over a wide visible light wavelength range. At that time, it is more preferred that $\lambda_1$ and $\lambda_2$ are apart by 0.05 $\mu$m. Because the ripple at a wavelength in the vicinity of $\lambda_1$ can be controlled by the top coating layer, while the ripple at a wavelength in the vicinity of $\lambda_2$ can be controlled by the undercoating film.

Further, when a color corresponding to a certain specific wavelength range is undesired, the two wavelengths may be set within the wavelength range, and the film thicknesses of the top coating and undercoating layers may be adjusted so that they correspond to $\lambda_1$ and $\lambda_2$, respectively. For example, when a red color is undesired, by adjusting the wavelength to $\lambda_1=0.58$ $\mu$m and $\lambda_2=0.65$ $\mu$m, it is possible to control the ripple in this wavelength range.

Such a anti-iridescent glass may be laminated on another glass substrate with the side on which the thin film is formed located inside and with a plastic interlayer interposed therebetween. FIG. 4 is a cross sectional view of one embodiment of such a anti-iridescent laminated glass of the present invention. 40 indicates a glass substrate, 41 indicates a high refractive index transparent thin film (the same as 11 in FIG. 1 and as 21 in FIG. 2), and 42 is a transparent undercoating film (the same as 12 in FIG. 1 and as 22 in FIG. 2), 43 is a transparent top coating film, and 44 is a plastic interlayer.

In such a case, the transparent top coating film 43 preferably has a refractive index n=0.65 to 1.8 and an optical film thickness nd=0.1 to 0.18 $\mu$m in order to control the reflection due to interference at the interface between the high refractive index transparent thin film 41 and the plastic interlayer 44. The material may be the same film as the transparent undercoating film 12.

Further, in the same manner as in the example in FIG. 2, by suitably shifting the main wavelengths $\lambda_3=4n_3d_3$ and $\lambda_4=4n_4d_4$ capable of preventing the reflection of the transparent top coating film 43 (refractive index: $n_3$, optical film thickness: $n_3d_3$) and transparent undercoating film 42 (refractive index: $n_4$, optical film thickness: $n_4d_4$), the wavelength range in which the remaining ripple is sufficiently controlled, can be enlarged, for instance, by adjusting them to $\lambda_3 \geq 0.55$ $\mu$m and $\lambda_4 \leq 0.55$ $\mu$m, or to $\lambda_3 \leq 0.55$ $\mu$m and $\lambda_4 \geq 0.55$ $\mu$m.

BEST MODE FOR CARRYING OUT THE INVENTION

Now, the reflection preventive films of the present invention will be described with reference to Examples.

EXAMPLE 1

Figure 7:
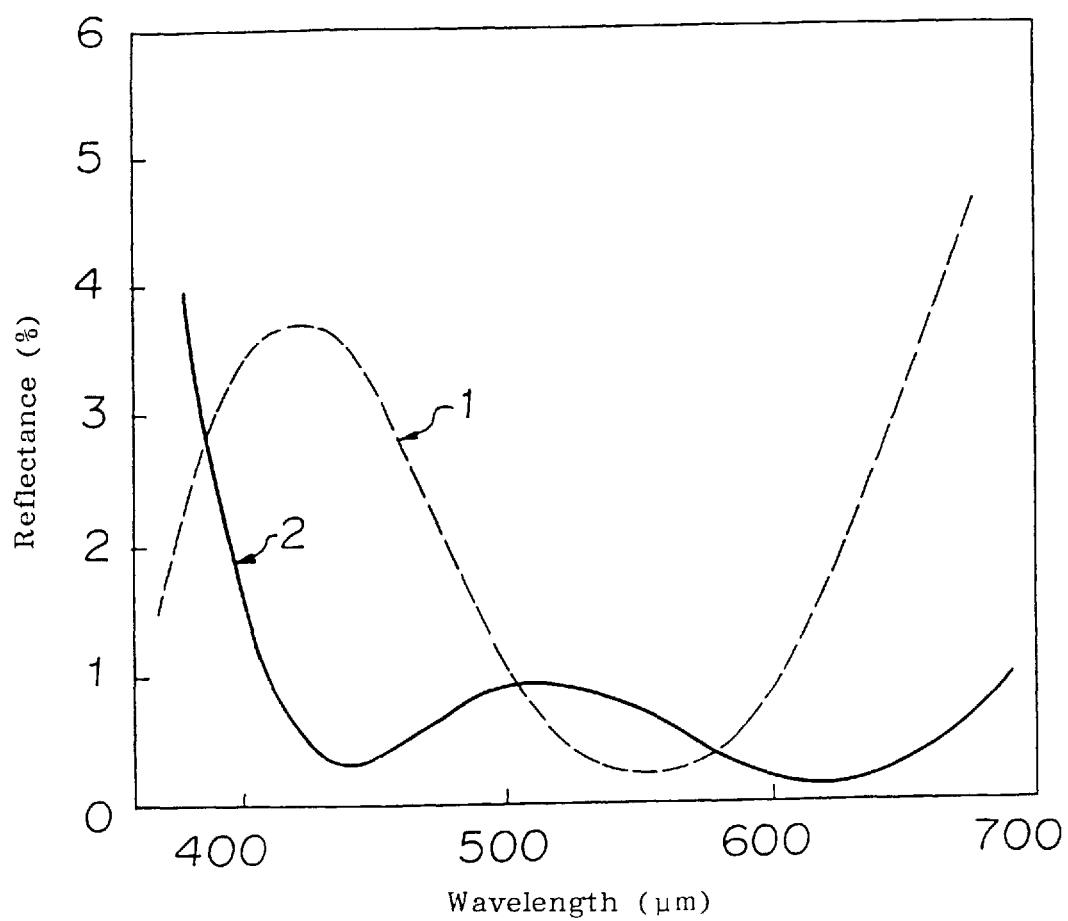
FIG. 7 shows the spectral reflection spectra in a visible region of samples used for the preparation of reflection preventive films of the present invention. In the Figure, 1 indicates a spectral reflection curve of the sample prepared in accordance with Example 1, and 2 indicates a spectral reflection curve of the sample prepared in accordance with Example 2.

On a cathode of an in-line system magnetron DC sputtering apparatus, an alloy target of of Zr:Si=10:90 and a metal target of Sn were set. A soda lime glass substrate was thoroughly cleaned by a method such as polishing and dried and then placed in a vacuum chamber, which was evacuated to a level of not higher than $1 \times 10^{-5}$ Torr by an oil diffusion pump. At this time, no heating of the substrate was conducted. Then, $O_2$ gas was introduced into the vacuum system, and the pressure was adjusted to $3.0 \times 10^{-3}$ Torr. In this state, a power of 2.7 W/cm$^2$ was applied to the metal Sn target to form a film of $SnO_2$ (refractive index: 2.0) in a thickness of 1144 Å. Then, the atmosphere in the vacuum system was completely replaced by a gas mixture of Ar:$O_2$=60:40, and the pressure was adjusted to $3.2 \times 10^{-3}$ Torr. In this state, a power of 3.6 W/cm$^2$ was applied to the Zr-Si alloy target to form a ZrSi$_y$O$_z$ film (refractive index 1.49) in a thickness of 675 Å. The film thickness was controlled in all cases by changing the transportation speed of the glass substrate passing in front of the target, but to improve the precision of the film thickness, an optical multi-color monitor was used in combination. The spectral reflection spectrum in the visual region of the sample thus prepared is shown by a dotted line 1 in FIG. 7 (the influence from the rear surface of the glass substrate is removed).

EXAMPLE 2

On the cathode of the in-line system magnetron DC sputtering apparatus as used in Example 1, an alloy target of of Zr:Si=8:2 was set instead of the metal Sn target. In the same procedure as in Example 1, a ZrSi$_x$O$_z$ film (refractive index: 2.05) having a thickness of 215 Å, a ZrSi$_y$O$_z$ film (refractive index: 1.49) having a thickness of 165 Å, a ZrSi$_x$O$_z$ film (refractive index: 2.05) having thickness of 926 Å and ZrSi$_y$O$_z$ film (refractive index: 1.49) having a thickness of 837 Å were sequentially formed on a soda lime glass substrate.

Further, as the film-forming conditions for this multilayered reflection preventive film, a gas mixture of Ar:$O_2$=7:3 was used as the sputtering gas, and a power of 7.8 W/cm$^2$ was applied to the alloy target of Zr-Si under a pressure of $3.5 \times 10^{-3}$ Torr. To accurately control the film thickness, an optical multi-color monitor was used in combination, as in Example 1. The spectral reflection spectrum in the visible region of the sample thus prepared is shown by a curve 2 in FIG. 7 (the influence from the rear side of the glass substrate was removed).

Now, the Examples for the electrically conductive glass provided with an alkali barrier film of the present invention will be described.

EXAMPLE 3

A usual glass sheet (soda-lime silica glass sheet) of 10 cm×10 cm×3 mm containing 15% of an alkali component $R_2O$ (R: Na, K) was thoroughly washed with a washing agent, then washed with water and dried. This glass sheet was placed in a vacuum chamber in a sputtering apparatus, and the chamber was evacuated to $1 \times 10^{-5}$ Torr. Then, a target comprising Zr and Si (Zr:Si=10:90) was subjected to DC sputtering in a gas mixture of argon and oxygen under a pressure of $2 \times 10^{-3}$ Torr to form a $Zr_{0.1}Si_{0.9}O_2$ film in a thickness of about 1000 Å.

COMPARATIVE EXAMPLE 1

To the same glass sheet as in Example 3, a $SiO_2$ film was formed in a thickness of 1000 Å by a CVD method using $SiH_4$ and $O_2$ gas. The product of Example 3 and the product of Comparative Example 1 were respectively maintained in contact with pure water at 90° C. for 24 hours, whereupon the amount of Na$^+$ eluted into the pure water was measured to investigate the alkali barrier property, whereby with the product of Example 3, the amount was 0.60 μg/cm$^2$, and with the product of Comparative Example 1, the amount was 0.61 μg/cm$^2$. Further, the product of Example 3 and the product of Comparative Example 1 were respectively washed with 5% NaOH and then contacted with pure water at room temperature for 24 hours, whereupon the amount of Na$^+$ eluted into the pure water (the amount of Na$^+$ adsorbed during the above washing) was measured to investigate the alkali absorptivity, whereby with the product of Example 3, the amount was 0.13 μg/cm$^2$ and with the product of Comparative Example 1, the amount was 0.14 μg/cm$^2$. This indicates that the product of Example 3 has substantially equal properties as the product of the Comparative Example.

EXAMPLE 4

In the same manner as in Example 3, a $Zr_{0.1}Si_{0.9}O_2$ film was formed in a thickness of about 200 Å.

EXAMPLE 5

In the same manner as in Example 3 except that as the target a ZrSi$_2$ target (Zr:Si=1:2) was used, a $Zr_{0.33}Si_{0.66}O_2$ film was formed in a thickness of about 22 Å.

EXAMPLE 6

In the same manner as in Example 5, a $Zr_{0.33}Si_{0.66}O_2$ film was formed in a thickness of about 500 Å.

The products of Examples 4 to 6 were respectively stored in contact with pure water at 85° C. for 24 hours, whereupon the alkali barrier properties and the alkali absorptivity were measured to obtain the results as shown in Table 4.

TABLE 4

| Sample | Alkali barrier film | Film thickness (Å) | Alkali barrier property Amount of eluted Na$^+$ (μg/cm$^2$) | Alkali adsorptivity Amount of adsorbed Na$^+$ (μg/cm$^2$) |
| --- | --- | --- | --- | --- |
| Product of Example 4 | $Zr_{0.1}Si_{0.9}O_2$ | 200 | 0.63 | 0.074 |
| Product of Example 5 | $Zr_{0.33}Si_{0.66}O_2$ | 200 | 0.43 | 0.031 |
| Product of Example 6 | $Zr_{0.33}Si_{0.66}O_2$ | 500 | 0.12 | 0.047 |

On each of the products of Examples 3 to 6, an alkali barrier film was formed by a DC sputtering method, and then on such an alkali barrier film, an ITO film was continuously formed by a DC sputtering method. Thereafter, the product was stored at 90° C. for 24 hours, whereby no change was observed on the appearance of the ITO film.

Further, in a case where Hf, Nb, Sn or La was used instead of Zr, the same results as in the above Examples were obtained, and the alkali barrier property was observed.

Now, Examples for the anti-iridescent glass of the present invention will be described.

EXAMPLE 7

Figure 1:
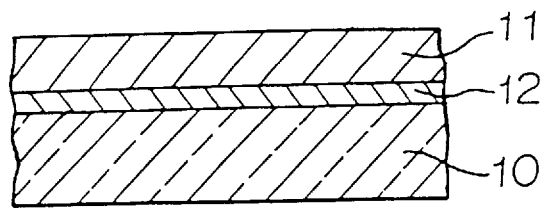
FIG. 1 diagrammatically illustrates the cross section of one embodiment of the present invention. In this Figure, 10 indicates a glass substrate, 11 indicates a high refractive index transparent thin film, and 12 indicates a transparent undercoating film.

A $ZrSi_xO_y$ film was formed on a glass substrate in a thickness of 900 Å by DC sputtering in an atmosphere of a mixture of Ar and oxygen under a vacuum of from $1\times10^{-3}$ to $1\times10^{-2}$ Torr using an alloy target of Zr: SI=1:2. The refractive index of this film was 1.74, which corresponds to nd=0.16 μm and $\lambda_2$=0.63 μm. An ITO thin film was formed thereon in a thickness of 8000 Å by ion plating. With respect to a separate ITO film formed in the same manner, the refractive index was measured and found to be 2.0. This sample was designated as Sample 1. (Structure of FIG. 1)

EXAMPLE 8

Figure 2:
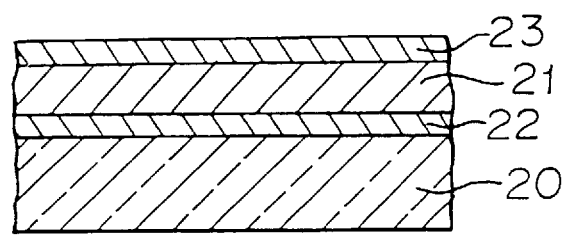
FIG. 2 diagrammatically illustrates the cross section of one embodiment of the present invention. In this Figure, 20 indicates a glass substrate, 21 indicates a high refractive index transparent thin film, 22 indicates a transparent undercoating film, and 23 indicates a transparent top coating film.

On Sample 1, a $SiO_2$ film was formed in a thickness of 900 Å by vapor deposition. With respect to a separate $SiO_2$ thin film formed in the same manner, the refractive index was measured and found to be 1.47, which corresponds to nd=0.13 μm and $\lambda_1$=0.52 μm. This sample was designated as Sample 2. (Structure of FIG. 2)

EXAMPLE 9

Figure 4:
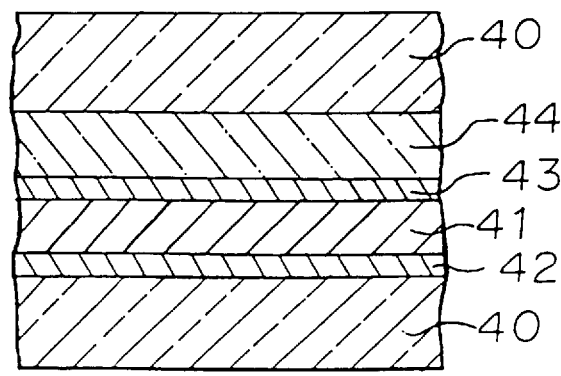
FIG. 4 is a cross section of one example of the anti-iridescent laminated glass of the present invention. In this Figure, 40 indicates a glass substrate, 41 indicates a high refractive index transparent thin film, 42 and 43 indicate the transparent undercoating film and the transparent top coating film, and 44 indicates a plastic interlayer.

Sample 1 was formed into a laminated glass using an interlayer of PVB (polyvinyl butyral), and the laminated glass was designated as Sample 3 (Structure of FIG. 4)

EXAMPLE 10

On the ITO film of Sample 1, a $ZrSi_xO_y$ film was formed in a thickness of 700 Å under the same conditions as in Example 1. The refractive index of this film was 1.74, which corresponds to nd=0.12 μm and $\lambda_2$=0.49 μm. This sample was bonded to another glass with an interlayer of PVB interposed therebetween to obtain a laminated glass. This laminated glass was designated as Sample 4. (Structure of FIG. 4)

Comparative Example 2

Figure 3:
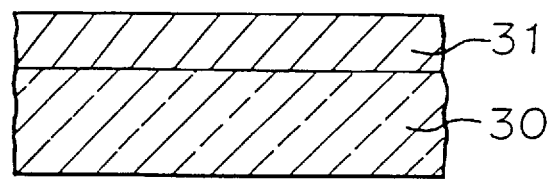
FIG. 3 diagrammatically illustrates the cross section of a conventional product. In this Figure, 30 indicates a glass substrate and 31 indicates a high refractive index transparent thin film.

On a glass substrate, an ITO thin film was directly formed in a thickness of 8000 Å by ion plating. The refractive index of this film was 2.0. This product was designated as Sample 5. (Structure of FIG. 3)

Comparative Example 3

Figure 5:
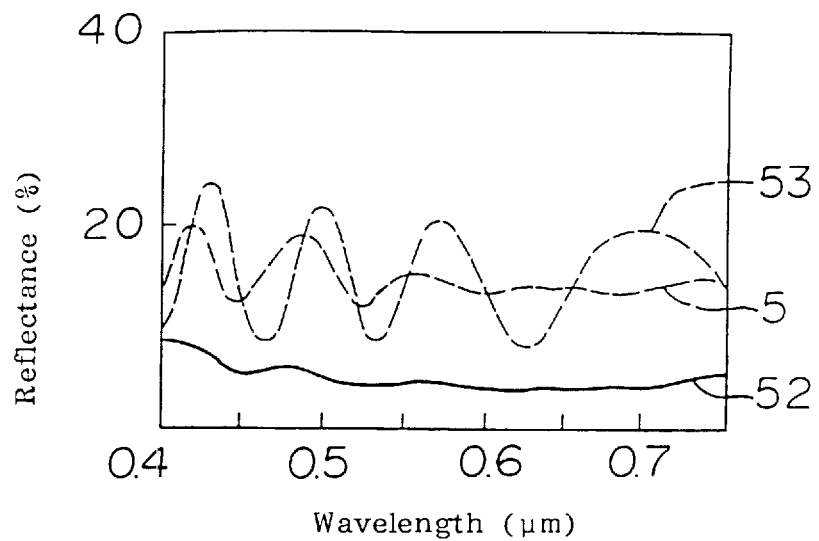
FIGS. 5 and 6 indicate spectral reflection spectra of samples in the Example and the Comparative Example.

Sample 5 was bonded to another glass with an interlayer of PVB interposed therebetween to obtain a laminated glass. This laminated glass was designated as Sample 6. The spectral reflection spectra of Samples 1, 2 and 5 are shown in FIG. 5. In the Figure, 51, 52 and 53 correspond to Samples 1, 2 and 5, respectively. In the case where a transparent undercoating film was formed according to the present invention (51), the ripple is evidently reduced as compared with the case without such undercoating film (53). This clearly indicates a iridescence-preventing effect. It is evident that the effect becomes more remarkable when a transparent top coating film is provided (52).

Figure 6:
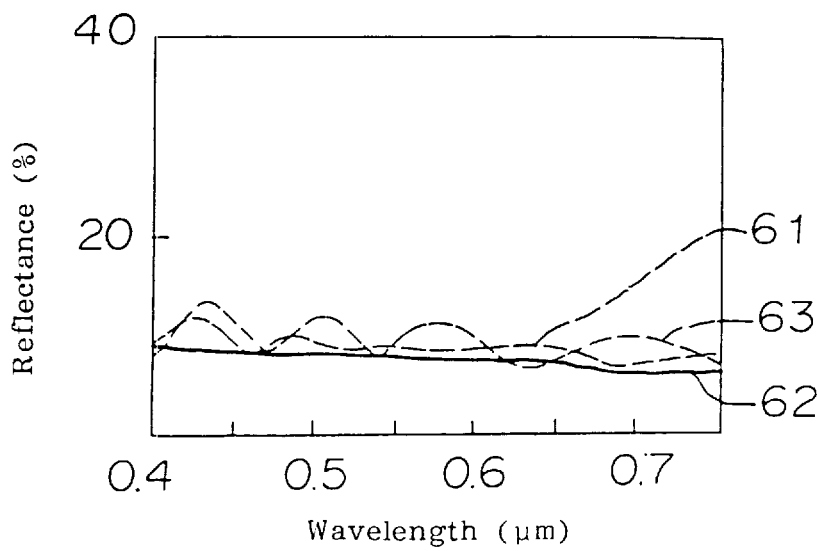

The spectral reflection spectra of Samples 3, 4 and 6 are shown in FIG. 6. In the Figure, 61, 62 and 63 correspond to Samples 3, 4 and 6, respectively. Like the case of FIG. 5, it is evident that the ripple-preventing effect is largest when a transparent undercoating and a transparent top coating film are formed on and under the high refractive index transparent thin film.

Industrial Applicability

By using the target of the present invention, a transparent thin film having a low refractive index and being excellent in the alkali resistance can be provided over a large area at a high speed under a stabilized condition. By its combination with a high refractive index oxide transparent thin film, the optical design of a thin film can be simplified.

Further, the low refractive index film of the present invention has chemical stability and can be used as an overcoat for various articles. For example, it is most suitable for a heat radiation reflective glass for buildings or vehicles, for a protective plate for the reader portion of a bar code reader, or for the outermost layer of a reflection preventive film, an eye glass lens, etc.

According to the present invention, the film comprising silicon dioxide as the main component can be formed by a DC sputtering method. Therefore, it can be combined with various physical vapor deposition methods employing a vacuum (such as vacuum vapor deposition, ion plating and sputtering). Thus, when a multi-layered film containing at least one layer of a film comprising silicon dioxide as the main component, is to be formed, each layer of such a multi-layered film can be formed continuously by a physical vapor deposition method without breaking the vacuum, whereby the production efficiency can remarkably be improved.

As described in the foregoing, according to the present invention, it is possible to present a anti-reflective film with a large area which used to be difficult to prepare. Especially, in the present invention, by using $ZrSi_yO_z$ films for both a high refractive index film and a low refractive index film, an effect for preventing interlaminar peeling can be expected. Further, the $ZrSi_{yOz}$ film is non-crystallized by the addition of Si, and has an improved surface smoothness, whereby an improvement in the abrasion resistance is also observed. The $ZrSi_yO_z$ film as the material for a low refractive index film to be used in the present invention is excellent in the alkali resistance as compared with a $SiO_2$ film, and believed to be dense with high hardness, whereby it is effective for an improvement in the chemical resistance of the prepared reflection preventive multi-layered film.

As described in the foregoing, according to the present invention, a multi-layered anti-reflective film can be prepared by an apparatus for an in-line DC sputtering method. And, this in-line DC sputtering method has a feature that control of the uniformity of the film thickness over a large area is relatively easy, and as a result, it is possible to prepare a anti-reflective film with a large area. Such a anti-reflective film with a large area can be used for a show window of a shop, for a casing for a doll, for a front glass for a picture, etc. Further, the capability of producing a product with a large area means that small products can be prepared in a large amount at the same time. This means a reduction of the production costs. Specific applications of this type include a front panel for a display, a cover glass for a solar cell, a lens for eye glasses, etc.

The electrically conductive glass provided with an alkali barrier film of the present invention is particularly suitable as a display device for e.g. a liquid crystal device, an electrochromic device or an electric field light emitting device, or as an alkali diffusion preventive film for an electrically conductive glass to be used for an amorphous solar cell substrate. As shown from Table 3, it has heat resistance and is stable and free from deterioration under various environmental conditions during or subsequent to the production of e.g. such a display device or a solar cell. Of course, it can be applied for other uses, for example, for an undercoating when an electrically conductive coating film, a heat radiation reflection preventive coating film, a reflection coating film, a coloring coating film or a coating film having other various functions is to be formed on a glass sheet for various transportation vehicles such as automobiles, aircrafts or railway vehicles, for buildings, for various apparatus, for optical equipments, for electrical parts or for electronic parts.

Further, when the periphery of a liquid crystal cell or the like is to be sealed, it is possible to prevent peeling of a sealing agent by alkali by interposing an alkali barrier film of the present invention between the sealing agent and the glass.

Further, the refractive index of the alkali barrier film of the present invention can be adjusted to a desired level by changing the proportions of Si and a metal such as Zr. Therefore, the alkali barrier film can be used in a wide range of the above-mentioned various applications.

Further, the alkali barrier film of the present invention has a low alkali absorptivity. Therefore, it can sufficiently be used even when the process for the production of a liquid crystal cell or the like includes a step of washing with an alkali-containing solution.

As is evident from the above Examples, in the present invention, when a high refractive index transparent thin film is to be formed on a glass substrate in a thickness beyond a certain degree, it is possible to control the ripple which appears in the spectrum, by interposing a transparent undercoating film inbetween.

It is thereby possible to obtain an effect for preventing color shading (glaring) due to the variation in the film thickness of the high refractive index thin film or due to the change of the sight angle. A remarkable effect can be obtained especially when this is applied to a glass substrate with a large area.

When a film comprising as the main component a composite oxide containing Si and a metal such as Zr or Ti, is used as a transparent undercoating film or as a transparent top coating film of the present invention, film forming can be conducted by a reflective sputtering method by means of a DC sputtering method. Accordingly all thin films including the high refractive index transparent thin film, can be formed continuously in-line i.e. to form a anti-iridescent glass by a physical vapor deposition method without breaking the vacuum, whereby the production efficiency will be remarkably improved.

A high refractive index transparent film can be formed without color shading on a glass with a large area according to the present invention, and it can be applied to applications with a large area without impairing the appearance, such as for a heat mirror for buildings, an electromagnetic shielding glass, an automobile electric heating windshield glass, a transparent conductive substrate for display, a transparent conductive substrate for a solar cell and an ultraviolet ray cutting glass.

We claim:

1. A target for sputtering comprising Si, as the main component, and Zr, wherein the amount of zirconium is at least 4 atoms relative to 96 atoms of Si.

* * * * *